(12) United States Patent
Shier et al.

(10) Patent No.: US 6,622,905 B2
(45) Date of Patent: Sep. 23, 2003

(54) DESIGN AND ASSEMBLY METHODOLOGY FOR REDUCING BRIDGING IN BONDING ELECTRONIC COMPONENTS TO PADS CONNECTED TO VIAS

(75) Inventors: Daniel E. Shier, Olympia, WA (US); Phil Geng, Portland, OR (US); Scott N. Dixon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/751,433

(22) Filed: Dec. 29, 2000

(65) Prior Publication Data

US 2002/0084312 A1 Jul. 4, 2002

(51) Int. Cl.$^7$ .................. B23K 31/02; B23K 31/00; H01L 23/02
(52) U.S. Cl. ................. 228/180.22; 228/180.21; 228/179.1; 438/618; 257/679
(58) Field of Search ............... 228/180.22, 180.21, 228/179.1; 438/122–125, 618; 257/679, 680, 698–700

(56) References Cited

U.S. PATENT DOCUMENTS

| | | | |
|---|---|---|---|
| 5,477,082 A | * 12/1995 | Buckley et al. | 257/769 |
| 5,491,303 A | * 2/1996 | Weiss | 174/262 |
| 5,517,041 A | * 5/1996 | Torii et al. | 257/206 |
| 5,535,101 A | * 7/1996 | Miles et al. | 367/808 |
| 5,585,675 A | * 12/1996 | Knopf | 257/774 |
| 5,640,048 A | * 6/1997 | Selna | 257/738 |
| 5,666,024 A | * 9/1997 | Vickers | 313/494 |
| 5,764,485 A | * 6/1998 | Lebaschi | 361/774 |
| 5,875,102 A | * 2/1999 | Barrow | 174/260 |
| 6,107,109 A | * 8/2000 | Akram et al. | 438/15 |
| 6,310,398 B1 | * 10/2001 | Katz | 257/773 |
| 6,380,060 B1 | * 4/2002 | Zohni | 228/180.1 |
| 6,403,460 B1 | * 6/2002 | Lin | 438/618 |
| 2002/0149102 A1 | * 10/2002 | Hashemi et al. | 257/706 |

* cited by examiner

Primary Examiner—Tom Dunn
Assistant Examiner—L. Edmondson
(74) Attorney, Agent, or Firm—Blakely, Sokoloff, Taylor & Zafman LLP

(57) ABSTRACT

An apparatus, comprising a substrate having a surface, comprising one or more solder pads, each having a center and connected to a via, each via having a center; positioned relative to the surface such that at least one of the one or more solder pad centers is offset from the connecting via center and an area of the at least one of the one or more solder pads overlaps an area of the connecting via.

20 Claims, 8 Drawing Sheets

VTB DESIGN

OVERLAP AREA

FIG. 1C    1. SEAL IS MADE

FIG. 1D    2. VOID IS FORMED

FIG. 1E    3. BALLS BRIDGE

VTB DESIGN

FIG. 2A

OVERLAP AREA

DESIGN AND ASSEMBLY METHODOLOGY FOR REDUCING BRIDGING IN BONDING ELECTRONIC COMPONENTS TO PADS CONNECTED TO VIAS

BACKGROUND OF THE INVENTION

1. Field of the Invention

This invention relates to the field of microchip assembly and in particular to connecting a die-substrate having a solder ball array to a substrate having a solder land array.

2. Discussion of Related Art

Figure 1A:
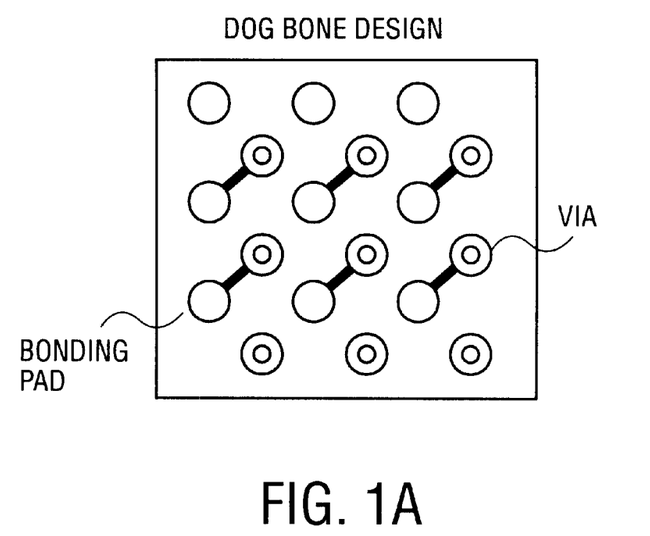
FIG. 1A is an illustration of a dog bone design for bonding pads and vias.
Figure 1B:
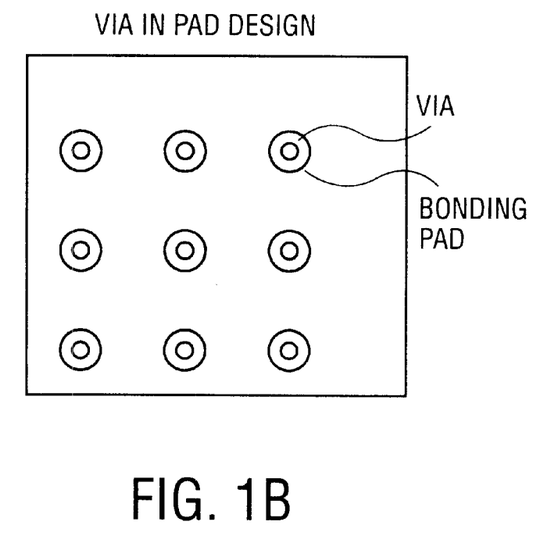
FIG. 1B is an illustration of a via in pad design.

The ever-increasing density improvements in silicon can be more fully exploited with corresponding wiring density improvements in chip carriers. Challenges to increased wire density have been met with ball grid array packaging designs. However, as the number of balls per unit area has increased, such as with C4 flip-chip designs, so have the routing problems. FIG. 1A illustrates a via-to-bonding pad design that is in the shape of a "dog bone". The dog bone design has the solder land (bonding pad) distinctly separate from the via and connected with routing. Along with the need to route each bonding pad (pad) to each via in the dog bone design, there is also the increased difficulty of routing other circuitry around the "dog bones". These routing problems can be reduced by designing with a via centered within the bonding pad ("via in pad" or VIP). FIG. 1B illustrates the pad centered on the via. VIP can free a number of routing channels and reduce the layer count but will also increase bridging caused by voids formed within the soldered balls. Solder ball bridging with the VIP design has been seen in up to 50% of product assembled in a high volume factory.

Figure 1C:
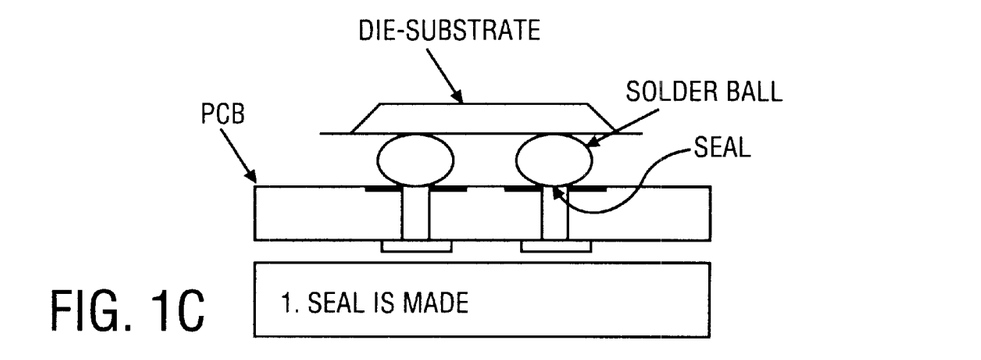
FIG. 1C is an illustration of solder balls contacting solder pads.
Figure 1D:
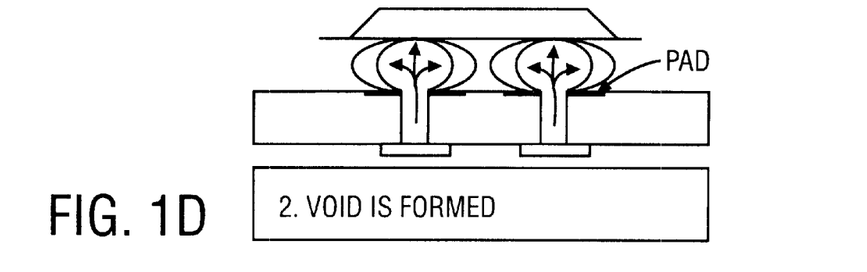
FIG. 1D is an illustration of via gas entering liquefied solder balls.
Figure 1E:
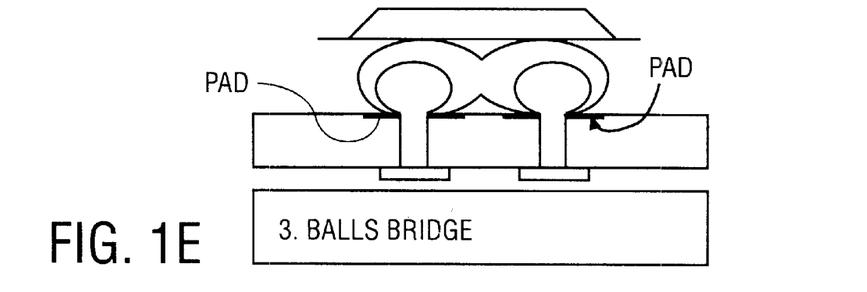
FIG. 1E is an illustration of expanding solder balls bridging.

FIGS. 1C–1E illustrate how bridging problems occur with via in pad designs on a substrate such as a printed circuit board (PCB). Bridging problems are a result of gas expansion from one or more vias into one or more mating solder balls of a die-substrate at an elevated temperature point in assembly. FIG. 1C illustrates how the problem begins when the solder ball, centered over the pad and therefore over the via hole, contacts the pad/via, seals the via opening along with any gas within. FIG. 1D illustrates how, during a reflow operation, the sealed via gas is unable to vent and expands into the solder ball as the solder begins to liquefy. FIG. 1E illustrates where, once the solder ball approaches a liquid state, the via gas can become encapsulated within the solder and continue to expand as temperature is increased. Via gas expansion has the effect of expanding the solder ball as if blowing up a balloon. The solder ball expansion can continue until it contacts an adjacent solder ball causing bridging to occur. The solder bridging problems discussed generally involve the use of eutectic solder in the solder ball. Eutectic solder will flow as a liquid during the reflow heating process.

Figure 1F:
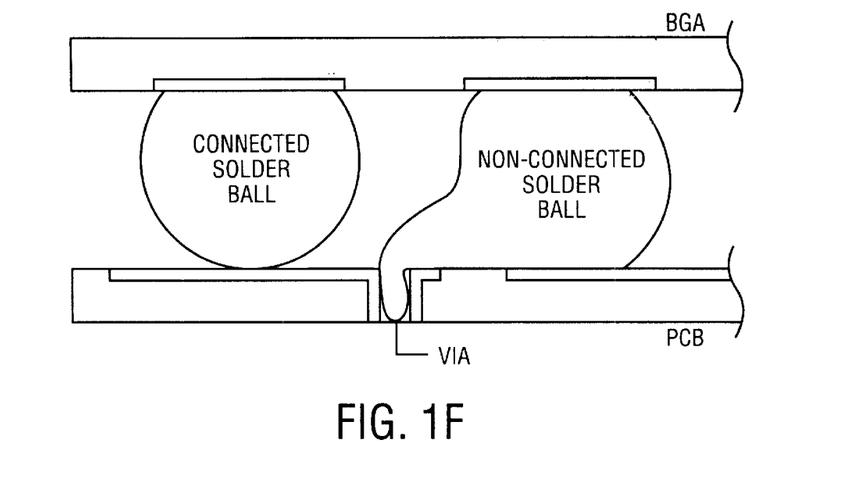
FIG. 1F is an illustration of bridging of a non-connected solder ball.
Figure 1G:
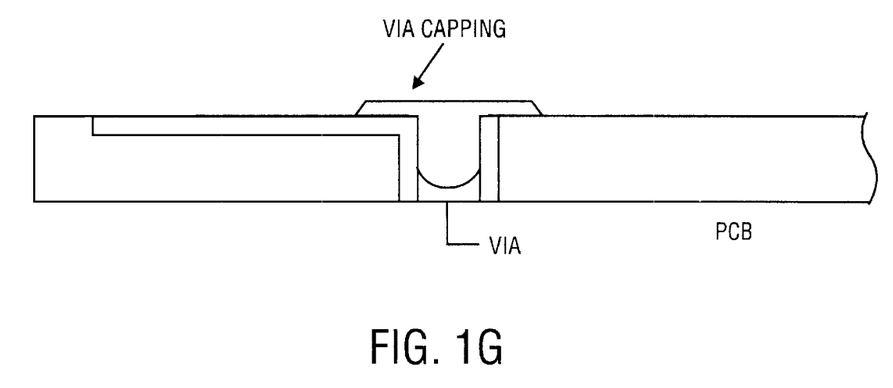
FIG. 1G is an illustration of via capping.

FIG. 1F illustrates another bridging problem where an adjacent (non-connected) solder ball flows to contact a via. This can occur when solder ball spacing is too close along with solder mask that is very narrow or missing. To minimize this condition, solder ball spacing can be increased or, as illustrated in FIG. 1G, caps placed over the vias on the substrate side contacted by the solder balls (primary side). These caps are placed on the substrate with solder mask material and constitute an additional process step. An increase in solder ball spacing can reduce solder ball density overall.

DETAILED DESCRIPTION OF THE PRESENT INVENTION

A structure and method for the placement, on a substrate surface, of a number of solder lands (pads) having areas that overlap onto a number of solder lined via openings (vias), is disclosed. The solder lands, while offset from the vias, maintain an overlapping area. Therefore an electrical connection between the solder land and the via is exists but a routing connection is not required.

The present invention provides an area of the solder land that is offset from an area of the solder lined via opening where some common area is maintained, that is, the two areas have some overlap. In an embodiment, the solder lands and vias may be on a substrate such as a printed circuit board (PCB). The solder lands and vias may be positioned in an array to connect with a mating solder ball array of a die-substrate.

Figure 2A:
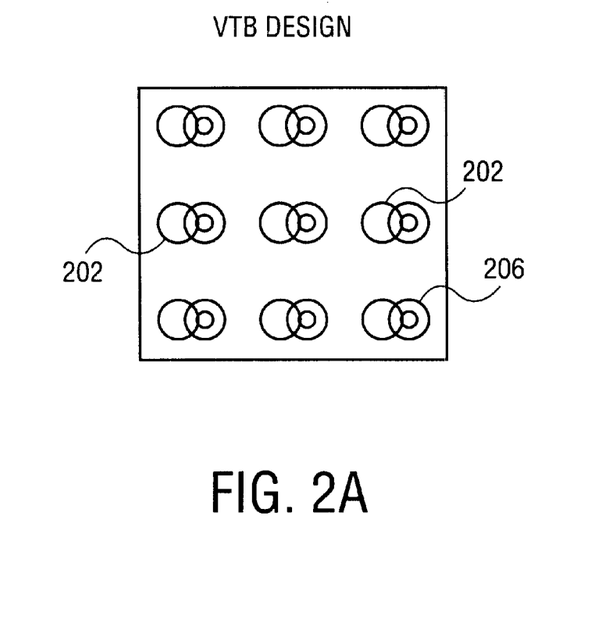
FIG. 2A is an illustration of a via tangent to pad design.
Figure 2B:
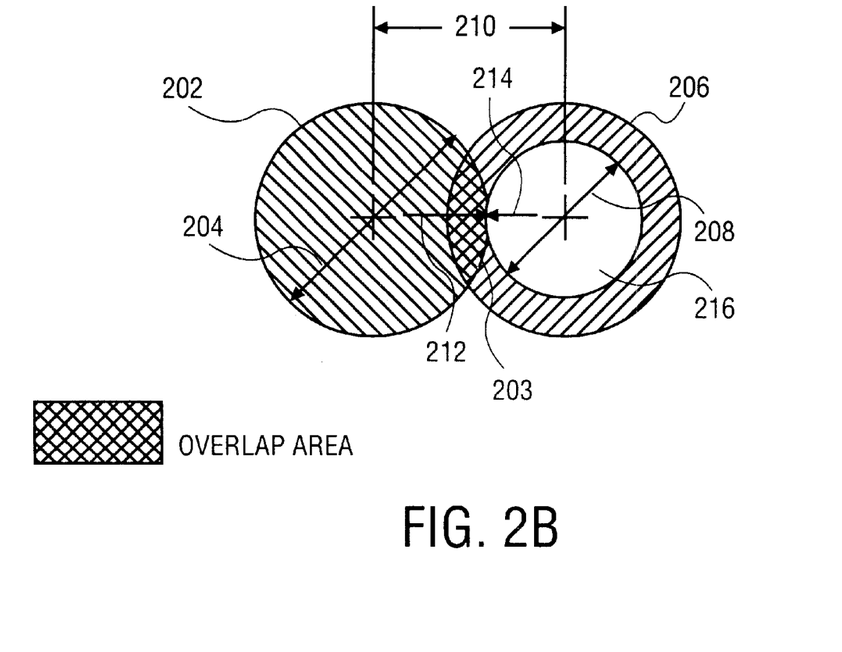
FIG. 2B is an illustration of overlap of a via tangent to pad.

FIGS. 2A & B illustrate a "via tangent to pad" (VTP) design. In an embodiment, the bonding pads 202 are circular having a diameter 204 where each bonding pad 202 area overlaps 203 with each via 206 area to be connected. In an embodiment, each bonding pad 202 can be positioned so that the pad diameter 204 is approximately tangent to the via opening (hole) diameter 208 it overlaps. This can be accomplished by a center-to-center spacing 210 between the bonding pads 202 and the vias 206 that is the sum of the bonding pad radius 212 and the via hole radius 214, producing the tangent. Closer center-to-center spacing 210 may be accomplished as long the overlap 203 still permits venting of gas from within the via 206 during solder reflow, i.e. the solder ball (not shown) does not completely seal off the via hole at a critical phase. The critical phase is a temperature point in reflow where sufficient gas must escape from the via, not to be encapsulated in the solder ball, and before liquid solder ball solder flows into the via hole 216.

Figure 3A:
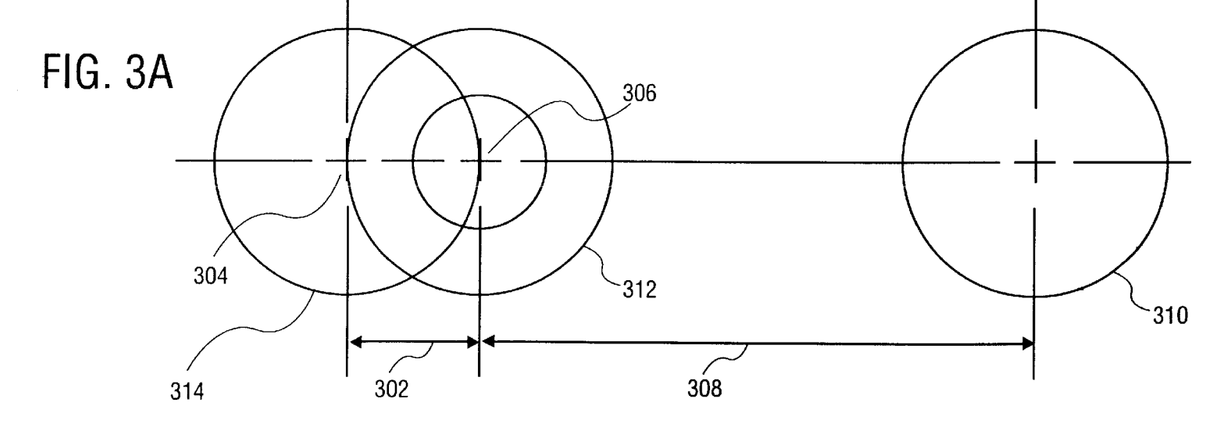
FIG. 3A is an illustration of a via across pad design.
Figure 3B:
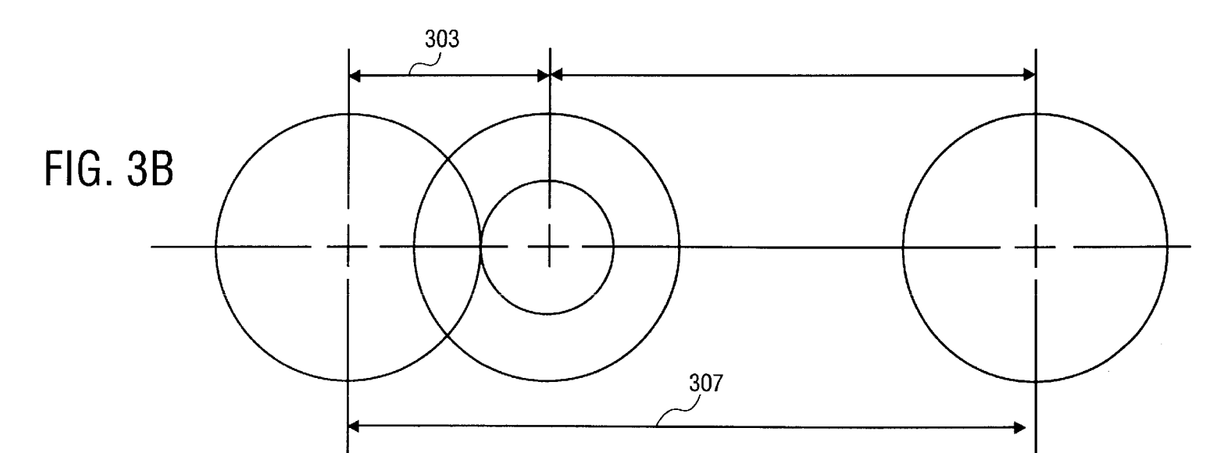
FIG. 3B is an illustration of a via tangent to pad design.

FIG. 3A illustrates an embodiment of a "via across pad" (VAP) design. This embodiment provides a closer positioning 302 of the solder pad to the connecting via than the VTP design 303 as shown in FIG. 3B. However, the VTP design may have a solder pad-to-solder pad center-to-center distance 307 that is approximately the same as the VAP design. The via across pad design (FIG. 3A) still maintains enough offset for via gas venting but allows for a closer packing of the via 312 to the connecting solder pad 314. With this embodiment, closer center-to-center 302 spacing between the solder pad center 304 and the via center 306 can increase the distance 308 between a non-connecting solder ball 310 and via 312, increase masking thicknesses between solder pads, and therefore reduce the possibility of a solder ball bridging to a non-connecting via. As a result, a process step of placing caps on the vias at the primary side (FIG. 1E) of the PCB can be eliminated. Capping vias could still be accomplished on the opposite (secondary) side since this is generally done for many vias on a PCB to eliminate the possibility of a solder leak. In addition, an increased distance between solder pads can allow for easier routing between solder balls and solder pads.

Figure 4A:
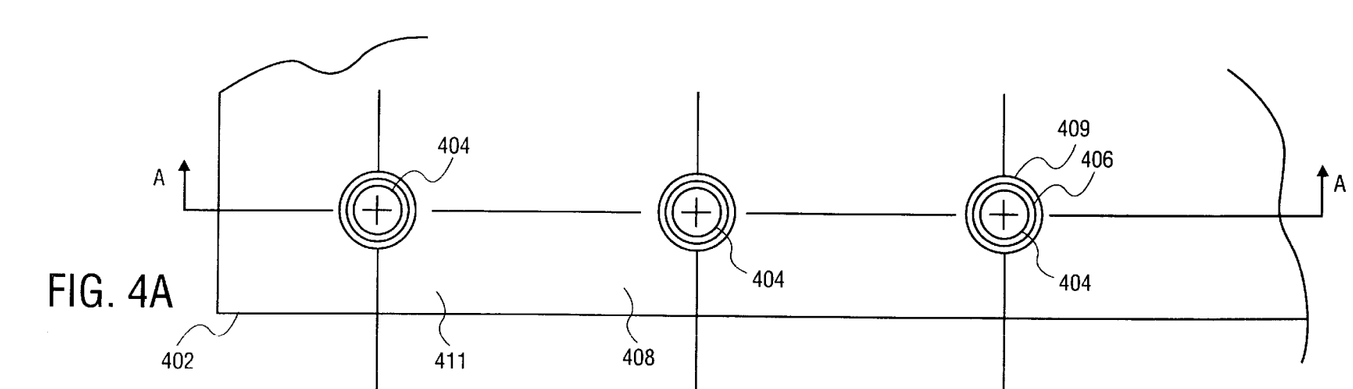
FIG. 4A is an illustration of a top view of a substrate with via openings.
Figure 4B:
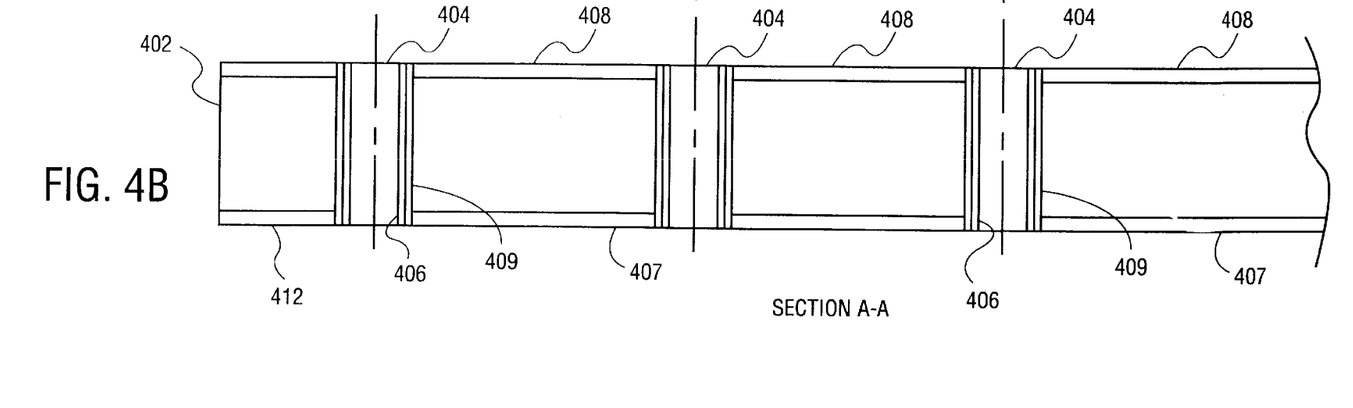
FIG. 4B is an illustration of a cross-section of the substrate with via openings.
Figures 5A, 5B:
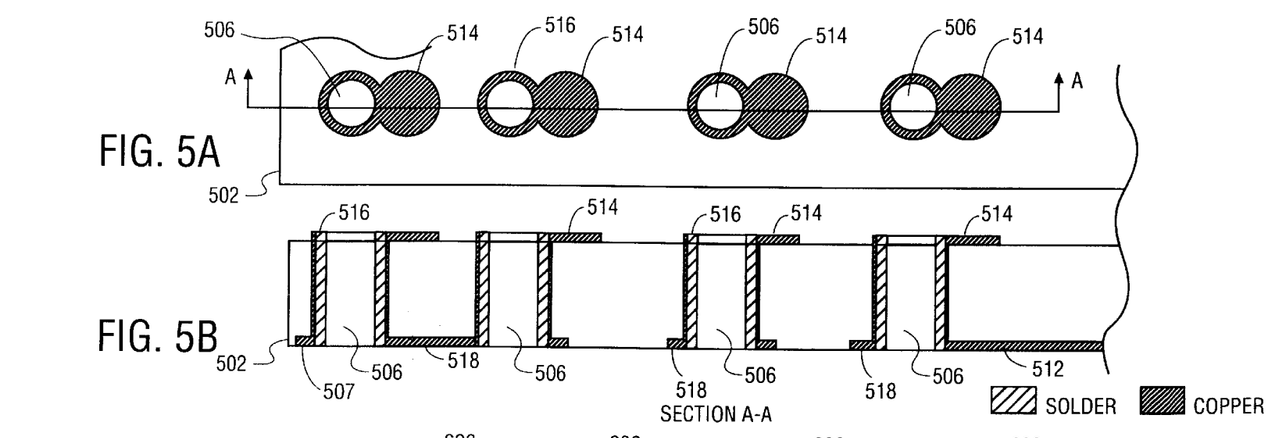
FIG. 5A is an illustration of the top view of the substrate with copper pads and via opening.
FIG. 5B is an illustration of the cross-section of the substrate with copper pads and via openings.
Figures 6A, 6B:
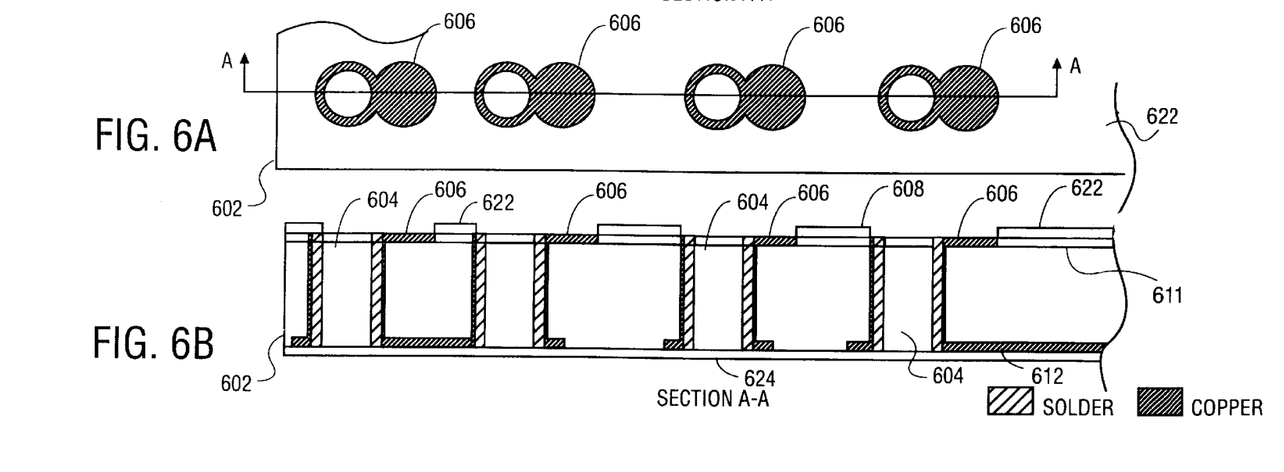
FIG. 6A is an illustration of the top view of the substrate with a solder mask having openings over the copper pads and via openings.
FIG. 6B is an illustration of the cross-section of the substrate with the solder mask having openings over the copper pads and via openings.
Figures 7A, 7B:
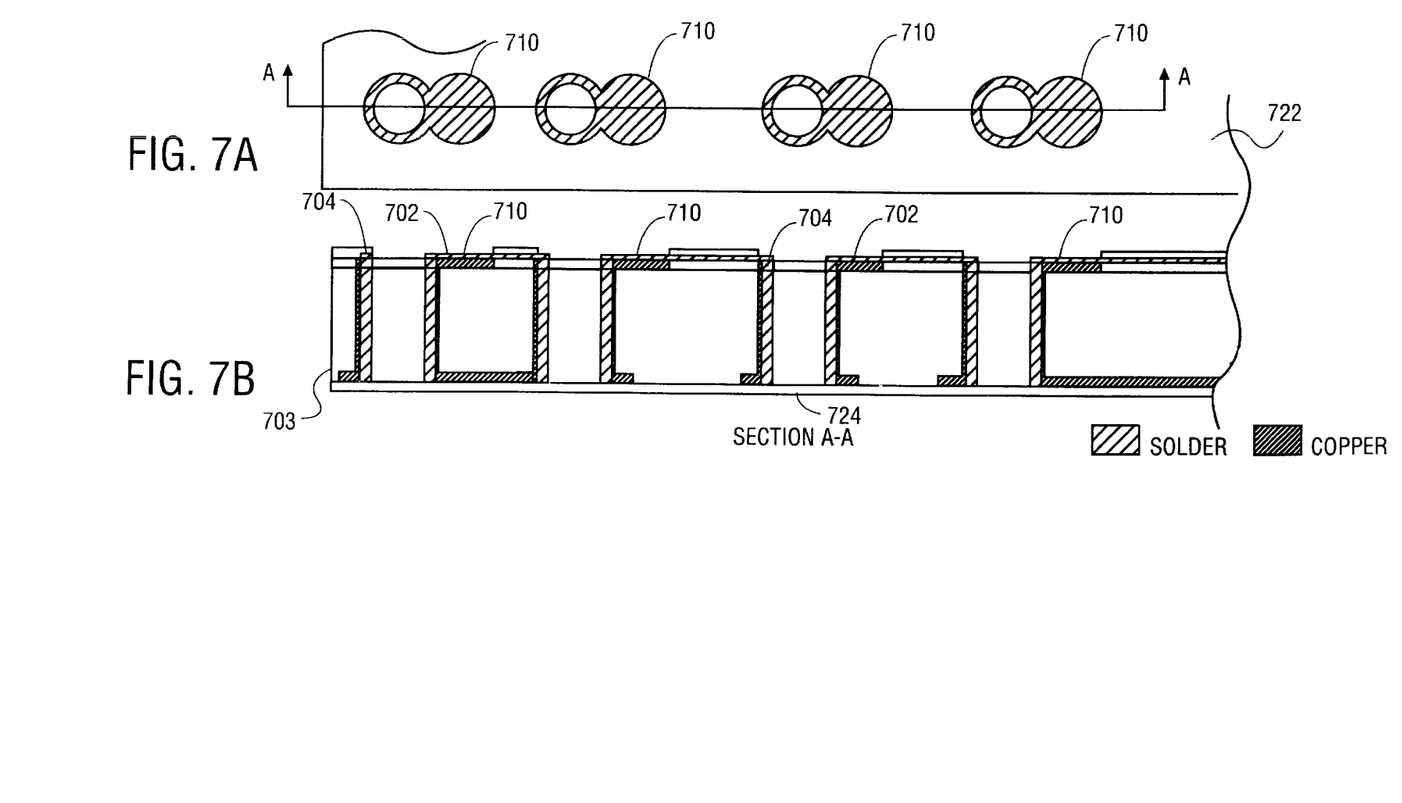
FIG. 7A is an illustration of the top view of the substrate with a layer of solder coating the copper.
FIG. 7B is an illustration of the cross-section of the substrate with the layer of solder coating the copper.

FIGS. 4A & B through FIGS. 7A & B illustrate an embodiment of a method to process a substrate and produce pads that overlap their connecting vias as with the via tangent to pad or the via across pad designs. Processing of the present invention begins, as FIGS. 4A & B illustrate, with a PCB substrate 402 having via openings 404 where the via openings 404 have deposited within, a solder coating 406 over a copper lining 409. The via openings 404 can run through the PCB substrate 402 and can be connected to a number of copper layers 407 and 408 on both sides of the PCB substrate 402. FIGS. 5A & B illustrate the results of a patterning operation where a photoresist coating (not shown) is applied to both copper surfaces 511 and 512 of the PCB substrate 502. The photoresist is developed to a pattern and the undeveloped photoresist areas removed with a solvent wash. Next, the copper layers 507 and 508 are etched to the pattern where the etching removes copper. A result can be that copper pads 514 and even copper edges 516 around via openings 506 are formed on one substrate surface 511. Elsewhere on the copper layers 507 and 508, other copper circuitry 518, including routing, may be created from the photoresist and etch processes. FIGS. 6A & B illustrate the application of a solder masks 622 and 624 that coat both sides 611 and 612 of the substrate 601. Prior to coating the solder masks 622 and 624, a photoresist coating (not shown) may be applied. The photoresist coating, can be pattern exposed and solvent washed to provide locations of photoresist coating around the via openings 604 and the pads 606. The solder mask 622 may be deposited by a process that applies the solder mask 622 to the substrate surface 611 except at the designated locations where the photoresist coating remains, e.g. over the vias 506 and at locations for solder pads 614. Alternatively, a solder mask stencil can be used. A second solder mask can coat the entire substrate opposite surface 624. Openings in the second solder mask 264 may be constructed as needed. FIGS. 7A & B illustrate the results of a wave soldering operation that can add a thin coating of solder 710 over the exposed surface of each copper pad 702 and via edge 704 of the substrate 703. The solder 710 will not adhere to solder mask material 722 and 724.

The bonding pad diameters and the via hole diameters are determined by the size of the corresponding solder balls, e.g. BGA substrates or C4 flip chip technologies, that connect to the bonding pads. In an embodiment using a BGA substrate, the bonding pads could have a diameter of approximately 0.30", the via hole diameter could be approximately 0.010", and the via outer diameter (OD) of the solder lining could be approximately 0.020–0.025". Therefore, to produce the via tangent to pad (VTP) configuration, the center-to-center spacing would be approximately 0.025–0.0275". With a via across pad (VAP) design, the center-to-center distance could be approximately 0.015" for a bonding pad that is approximately 0.030" in diameter and a via OD of approximately 0.020–0.025". In this case, the pad position, relative to the connecting via, would be such that the pad diameter would cross through the connecting via hole center (FIG. 3A). However, even closer arrangements (not shown) between the pad and the connecting via are possible as long as via gas will not vent into the softening solder ball sufficient to cause solder ball bridging to an adjacent solder ball.

Bonding pads are typically round for convenience and positioned in an array. However, it is not necessary to have round bonding pads or bonding pads placed in an array, to practice the present invention. The present invention can be used with any bonding pad shape. It is only necessary to have overlap to provide the density of vias chosen in the design, the desired spacing between adjacent solder balls, while maintaining a sufficient offset between the via hole and the connecting solder ball to allow venting until the critical phase has passed, i.e. enough gas has vented and/or the heated solder ball has flowed without entraining any gas. Therefore, the offset dimension (as characterized by the center-to-center spacing) will vary with the solder ball size, the type of solder used, and the spacing provided between via holes, To maximize the density of vias, the offset bonding pads may be aligned in the any direction that meets the density required to mate with the die-substrate solder balls.

We claim:
1. An assembly, comprising:
   a substrate having a surface, comprising:
      one or more solder pads, each having a center and connected to;
      a via, each via having a center positioned relative to the surface such that at least one of the one or more solder pad centers is offset from the connecting via center and an area of at least one of the solder pads partially overlaps an area of the connecting via.
2. The assembly of claim 1, further comprising:
   each of the one or more solder pads having a diameter;
   each via having a hole diameter; such that the hole diameters are approximately tangent to the overlapping solder pad diameters.
3. The assembly of claim 1, wherein the one or more solder pads are positioned in an array.
4. The assembly of claim 3, wherein the connecting vias are positioned in an array.
5. The assembly of claim 4, wherein only one of the one or more solder pads overlaps a via.
6. An assembly, comprising:
   a die-substrate having an array of solder balls;
   a second substrate comprising:
      an array of solder pads, offset from
      an array of vias, such that an area of each solder pad partially overlaps a portion of one of the array of vias and the die-substrate is connected to the second substrate with the solder ball array soldered to the solder pad array.

7. The assembly of claim 6, wherein the die-substrate is a ball grid array package.

8. The assembly of claim 6, wherein the die-substrate is a C4 flip chip.

9. A method comprising:
obtaining a substrate surface comprising:
vias, and
one or more copper layers;
screening at least one of the one or more copper layers to provide an array of solder pads that are offset from an array of connecting via openings and where at least one solder pad in the array partially overlaps with a via opening on the substrate surface.

10. The method of claim 9, further comprising:
overlapping the at least one solder pad location includes forming a diameter defining the at least one solder pad where the diameter is tangent to a hole diameter for the connecting via.

11. The method of claim 9, further comprising:
overlapping the solder pad locations includes forming a diameter defining each solder pad where the diameter passes through a center of each connecting via.

12. The method of claim 11, further comprising:
obtaining a die-substrate having a solder ball array; and
attaching the die substrate to the substrate connecting the solder ball array to the solder pad array.

13. An apparatus, comprising:
a substrate having a surface;
means for partially overlapping one or more solder pads with one or more vias on the substrate surface.

14. The apparatus of claim 13, wherein the solder pads and the vias are positioned in an array.

15. The apparatus of claim 14, further comprising:
means for connecting a die-substrate having a ball grid array to the substrate having the solder pad array such that, essentially, no voids are formed within the solder connections.

16. An assembly, comprising:
a substrate having at least one via plug on one side;
one or more solder pads on an opposite side of the substrate, each solder pad having a center and connected to;
a via, each via having a center positioned relative to the surface such that at least one of the one or more solder pad centers is offset from the connecting via center and an area of the at least one solder pad partially overlaps an area of the connecting via.

17. The assembly of claim 16, further comprising:
each of the one or more solder pads having a diameter;
each via having a hole diameter; such that the hole diameters are approximately tangent to the overlapping solder pad diameters.

18. The assembly of claim 16, wherein the one or more solder pads are positioned in an array.

19. The assembly of claim 18, wherein the connecting vias are positioned in an array.

20. The method of claim 12, wherein the partial overlapping allows for close center-to-center spacing with via outgassing.

* * * * *